(12) United States Patent
Chang et al.

(10) Patent No.: US 6,754,105 B1
(45) Date of Patent: Jun. 22, 2004

(54) TRENCH SIDE WALL CHARGE TRAPPING DIELECTRIC FLASH MEMORY DEVICE

(75) Inventors: Chi Chang, Redwood City, CA (US); Wei Zheng, Santa Clara, CA (US); Hidehiko Shiraiwa, San Jose, CA (US)

(73) Assignees: Advanced Micro Devices, Inc., Sunnyvale, CA (US); Fujitsu Limited, Kanagawa (JP)

( * ) Notice: Subject to any disclaimer, the term of this patent is extended or adjusted under 35 U.S.C. 154(b) by 0 days.

(21) Appl. No.: 10/430,582

(22) Filed: May 6, 2003

(51) Int. Cl.[7] .................. G11C 16/04; H01L 29/792
(52) U.S. Cl. .................. 365/185.18; 365/185.28; 257/324
(58) Field of Search ............... 365/185.18, 185.28, 365/185.33; 257/324

(56) References Cited

U.S. PATENT DOCUMENTS

| 6,011,725 A | * | 1/2000 | Eitan ................. 365/185.33 |
| 6,215,702 B1 | | 4/2001 | Derhacobian et al. . 365/185.33 |
| 6,388,293 B1 | * | 5/2002 | Ogura et al. ............. 257/324 |
| 6,418,060 B1 | * | 7/2002 | Yang et al. .......... 365/185.28 |
| 6,456,533 B1 | | 9/2002 | Hamilton et al. ...... 365/185.18 |

OTHER PUBLICATIONS

T. Saito, et al., Split Gate Cell with Phonon Assisted Ballistic CHE Injection, IEEE 2000 Symposium on VLSI Technology Digest of Technical Papers, pp. 126–127.

Yutaka Hayashi, et al., Twin MONOS Cell with Dual Control Gates, IEEE 2000 Symposium on VLSI Technology Digest of Technical Papers, pp. 122–123.

Wei–Ming Chen, et al., A Novel Flash Memory Device with Split Gate Source Side Injection and ONO Charge Storage Stack (SPIN), IEEE 1997 Symposium on VLSI Technology Digest of Technical Papers, pp. 63–64.

* cited by examiner

Primary Examiner—Trong Phan
(74) Attorney, Agent, or Firm—Renner, Otto, Boisselle & Sklar, LLP (57) ABSTRACT

A memory device that includes a charge trapping region disposed laterally adjacent a first end of a channel such that energetic electrons traversing the channel can be ballistically injected into the charge trapping region.

32 Claims, 4 Drawing Sheets

TRENCH SIDE WALL CHARGE TRAPPING DIELECTRIC FLASH MEMORY DEVICE

TECHNICAL FIELD

The present invention relates generally to the field of non-volatile memory devices and, more particularly, to a trench side wall charge trapping dielectric flash memory device, a corresponding core memory array and a method of operating the memory device.

BACKGROUND

Figure 10:
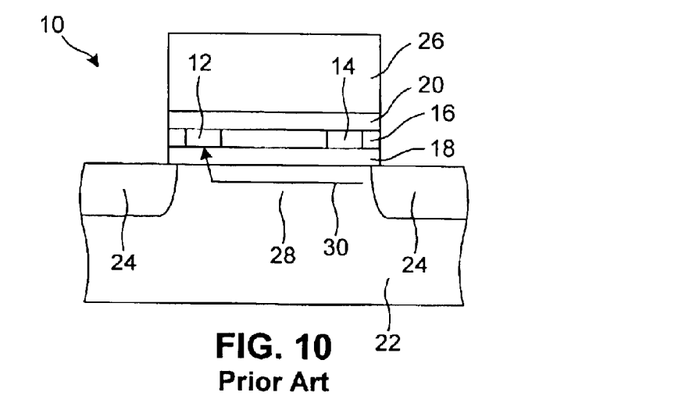
FIG. 10 is a schematic cross-section illustration of a conventional charge trapping dielectric flash memory device.

A pervasive trend in modern integrated circuit manufacture is to increase the amount of data stored per unit area on an integrated circuit memory unit, such as a flash memory unit. Memory units often include a relatively large number of core memory devices (sometimes referred to as core memory cells). For instance, a conventional dual bit memory device, such as a charge trapping dielectric flash memory device 10 as illustrated in FIG. 10, can store data in a "double-bit" arrangement. That is, one bit can be stored using a first charge storing region 12 on a first "side" of the memory device 10 and a second bit can be stored using a second charge storing region 14 on a second "side" of the memory device 10.

The charge storing regions 12, 14 are part of a non-conductive charge trapping layer 16 that is disposed between a bottom (or tunnel) dielectric layer 18 and a top dielectric layer 20. This dielectric stack can be formed over a P conductivity type substrate 22 having a first and a second bit line 24 disposed therein. A conductive word line 26 can be formed over the dielectric stack for serving as a gate electrode. The bit lines 24 can be formed from N conductivity type material and, upon application of appropriate voltages to the word line 26 and/or the bit lines 24, the bit lines 24 can respectively function as a source and a drain with an active channel region 28 defined therebetween. In addition, by the appropriate application of voltage potentials to the gate electrode, the source and/or the drain, each charge storing region 12, 14 can be programmed to store an amount of charge corresponding to a programmed, or charged, data state (as opposed to an unprogrammed, or blank, data state). The memory device 10 can also be read to determine the data state and can be erased by the appropriate application of voltage potentials to the gate electrode, the source and/or the drain.

Programming of the charge storage regions 12,16 involves channel hot electron (CHE) injection. For example, the first charge storing region 12 can be programmed to the charged data state by applying a voltage potential to the bit line 24 adjacent the first charge storing region 12 (such that this bit line 24 functions as a drain), applying a voltage potential to the word line 26 (such that the word line 26 functions as a gate electrode), and grounding the bit line 24 adjacent the second charge storing region 14 (such that this bit line 24 functions as a source). The source functions as a source of electrons for the CHE programming of the charge storing cell 12.

The voltages applied to the gate electrode, the source and the drain generate a vertical electric field through the dielectric stack (layers 16, 18 and 20) and a lateral electric field along the length of the channel 28 from the source to the drain. At a given threshold voltage, the channel 28 will invert such that electrons are drawn off the source and begin accelerating toward the drain. As the electrons move along the length of the channel, the electrons gain energy and upon attaining enough energy, the electrons are able to jump over the potential barrier of the bottom dielectric layer 18 and into the charge storing layer 16 where the electrons become trapped. The probability of electrons jumping the potential barrier is a maximum in the area of the charge storing region 12 adjacent the drain, where the electrons have gained the most energy. These accelerated electrons are termed hot electrons and once injected into the charge storing layer 16, stay in the charge storing region 12 of the charge storing layer 16. The trapped electrons tend not to spread through the charge storing layer 16 due to this layer's low conductivity and low lateral electric field therein. Thus, the trapped charge remains localized in the charge trapping region 12 close to the drain 24.

It is noted that the hot electrons must be diverted from their source to drain path in order to become injected in to the charge storing layer 16. Typically, the injected electrons are scattered by phonons in the channel 28 such that these electrons are drawn upward by the vertical electric field mentioned above. The foregoing technique to program the first charge storing region 12 can be used to program the second charge storing region 14, but the functions of the bit lines 24 (i.e., the source and drain functions) are reversed.

Programming one of the charge storing regions 12, 14 to the charged data state using CHE involves a fairly high drain to source ($I_{ds}$) current (e.g., on the order of about two hundred micro-Amps ($\mu A$)). Over the course of programming hundreds, thousands or even millions of memory devices 10 contained in a memory unit, a significant amount of power can be consumed. In addition, the ratio of injected electrons (i.e., those scattered electrons that are drawn upward and have enough energy to overcome the potential barrier of the bottom dielectric layer 18 and into the charge storing layer 16 as indicated by arrow 30) to the total number of electrons traversing the channel 28 is fairly low. In other words, CHE can be a relatively inefficient process for a conventional memory device 10.

In view of the foregoing, there is a need in the art for improved flash memory devices that can consume less power during programming and for improved methods of operating the flash memory devices.

SUMMARY OF THE INVENTION

According to one aspect of the invention, the invention is directed to a memory device. The memory device includes a semiconductor channel controlled by a gate electrode; a charge trapping region disposed laterally adjacent a first end of the channel; a first conductive region disposed adjacent the first end of the channel and functioning as a drain during programming of the charge trapping region, and a second conductive region disposed adjacent a second end of the channel and functioning as a source during programming of the charge trapping region, and wherein during programming of the charge trapping region electrons are drawn off the source and into the channel, the electrons traverse the channel from second end to first end and become energetic during the traversal so as to ballistically become injected into the charge trapping region through the first end of the channel.

According to another aspect of the invention, the invention is directed to a memory device. The memory device includes a) a first charge trapping region having at least a portion thereof disposed laterally adjacent a first end of a channel region and separated from the channel by a first tunnel dielectric region; b) a first select gate disposed laterally adjacent the first charge trapping region opposite the channel and separated from the first charge trapping region by a first select gate dielectric region; c) a second charge trapping region having at least a portion thereof disposed laterally adjacent a second end of a channel region and separated from the channel by a second tunnel dielectric region; d) a second select gate disposed laterally adjacent the second charge trapping region opposite the channel and separated from the second charge trapping region by a second select gate dielectric region; e) a control gate disposed over the channel and separated therefrom by a control gate dielectric; f) a first conductive region having at least a portion thereof disposed under the first end of the channel adjacent the first tunnel dielectric region; and g) a second conductive region having at least a portion thereof disposed under the second end of the channel adjacent the second tunnel dielectric region.

According to yet another aspect of the invention, the invention is directed to a core memory array. The core memory array includes a plurality of trench assemblies, each trench assembly formed in a semiconductor substrate and including a select gate disposed between a first and a second charge trapping region and separated from the charge trapping regions by respective select gate dielectric regions, the select gate at least partially overlapping each of the charge trapping regions in a lateral direction; a plurality of word lines disposed over the trench assemblies and extending in a transverse direction to the trench assemblies, each word line defining a channel in the substrate between adjacent pairs of trench assemblies, a portion of each channel at least partially overlapping each of the charge trapping regions in a lateral direction; and a bit line associated with each trench assembly having a least a first portion thereof disposed under an end of the channel adjacent the first charge trapping region and a second portion thereof disposed under an end of the channel adjacent the second charge trapping region.

According to still another aspect of the invention, the invention is directed to a method of programming a memory device having a dielectric charge trapping region. The method includes moving an electron laterally within a channel, the channel having a first end at least partially overlapping the charge trapping region in a lateral direction, the electron gaining energy during lateral movement within the channel; and ballistically injecting the electron into the charge trapping region through the first end of the channel and through a tunnel dielectric layer.

BRIEF DESCRIPTION OF DRAWINGS

These and further features of the present invention will be apparent with reference to the following description and drawings, wherein.

DISCLOSURE OF INVENTION

In the detailed description that follows, like components have been given the same reference numerals, regardless of whether they are shown in different embodiments of the present invention. To illustrate the present invention in a clear and concise manner, the drawings may not necessarily be to scale and certain features may be shown in somewhat schematic form.

Figure 1:
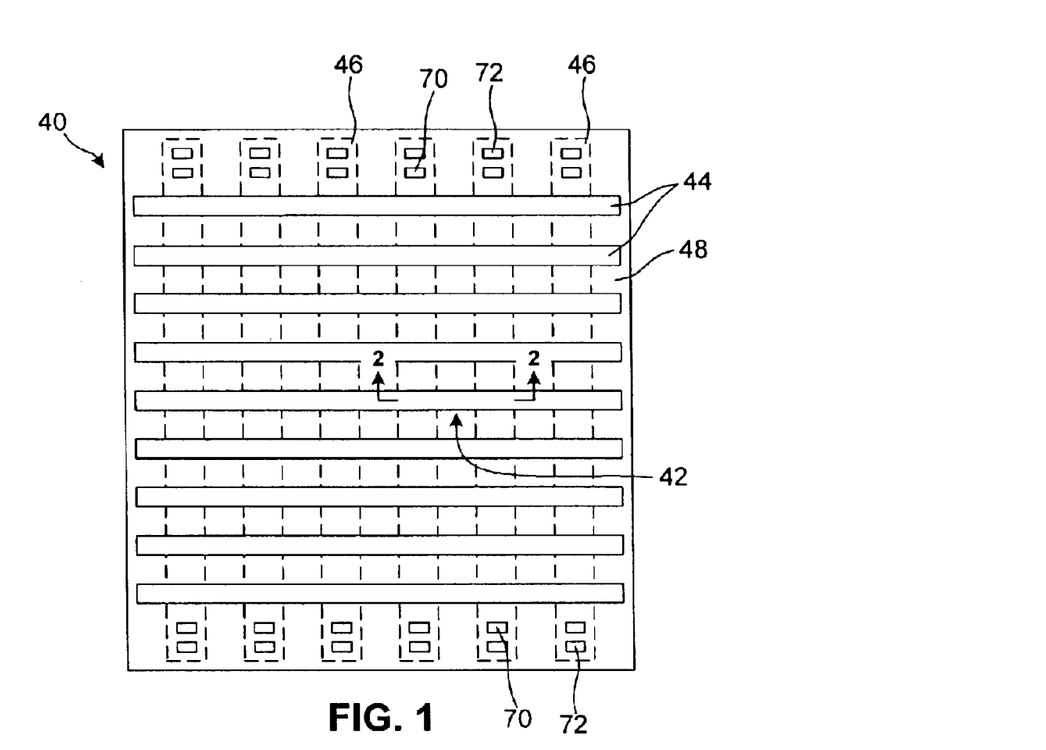
FIG. 1 is a schematic block diagram of a portion of a core memory array from a memory unit that can include a plurality of flash memory devices fabricated in accordance with the present invention.

With reference to FIG. 1, shown is a top view schematic block diagram of a portion, or sector, of a core memory array 40 from a memory unit that can include a plurality of core memory devices 42. In accordance with certain aspects of the invention and as discussed in greater detail below, the memory devices 42 can be formed as trench side wall charge trapping dielectric memory devices. The memory unit can also include a logic circuit (not shown) for use in controlling various operations (e.g., programming, reading and/or erasing) of the core memory array 40 and external (or static) references (not shown) for using in generating various reference currents, such as an erase verify reference, a soft-program verify reference and a program verify reference. As one skilled in the art will appreciate, the core memory devices 42 can be used by a customer of the memory unit to store information, such as data or executable code.

The core memory array 40 can include a plurality of word lines (also referred to herein as control gate lines 44) and trench assemblies 46. The control gate lines 44 are disposed over and separated from the trench assemblies 46 by an insulating, or dielectric, layer 48 in a grid arrangement (e.g., the control gate lines 44 are disposed in a transverse direction to the trench assemblies 46). The control gate lines 44 and the trench assemblies 46 operatively form the core memory devices 42. Although not described in great detail herein, some of the core memory devices 42 can be used as dynamic reference devices to assist in reading the remaining core memory devices 42 by tracking drift in threshold voltage of the core memory devices 42 over multiple program/erase (P/E) cycles and aging of the memory unit.

Figure 2:
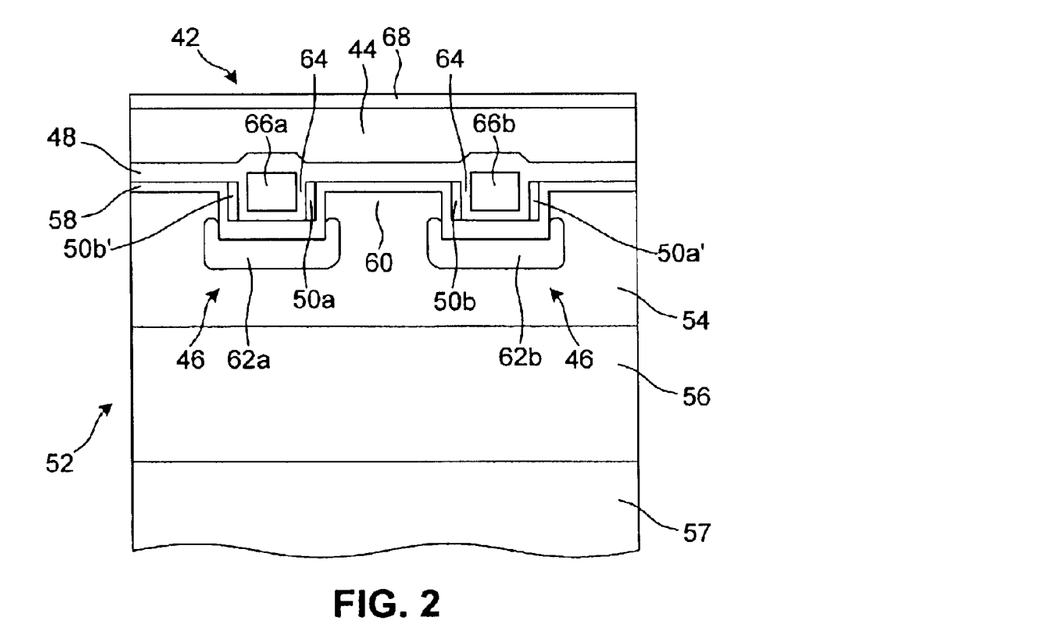
FIG. 2 is a schematic cross-section illustration of an exemplary memory device taken along the line 2—2 of FIG. 1.

With additional reference to FIG. 2, each memory device 42 includes a complimentary pair of charge trapping regions 50a and 50b (also referred to as charge storing regions or charge storing cells). Therefore, each memory device 42 can be considered a dual cell, non-volatile, flash electrically erasable and programmable memory device 42. Each charge trapping region 50 can store distinguishable charge amounts indicative of at least two data states. For example, the data states can represent binary values such as a logical zero and a logical one. The logical one, for example, can be implemented by leaving the desired charge trapping region 50 in an unprogrammed state (also referred to as an uncharged or erased or blank program level). The logical zero, for example, can be implemented by storing an amount of charge in the desired charge trapping cell 50 (the storing of charge also referred to as a charged state, programmed state, programmed level or charged program level).

The charge trapping regions 50a and 50b are formed from sidewall charge trapping layers formed as part of the trench assemblies 46. The charge trapping regions 50a and 50b can be made from, for example, a nitride (e.g., silicon nitride or $Si_3N_4$) or other suitable material. In one embodiment, the charge trapping regions 50 have a lateral thickness of about fifty angstroms (Å) to about one hundred angstroms (Å). Each trench assembly 46 is formed in a trench 84 (FIG. 5) formed in a semiconductor (e.g., silicon) substrate 52. More specifically, the trenches are formed in a P-well 54 (e.g., semiconductor material that has been doped to have P-type conductivity) of the substrate 52. As will be discussed in greater detail below, the trenches can be about three hundred angstroms (Å) to about 1,500 angstroms (Å) deep and about 1,000 angstroms (Å) to about 3,000 angstroms (Å) wide. Each trench can be spaced apart by about 500 angstroms (Å) to about 1,000 angstroms (Å), for a trench pitch of about 1,500 angstroms (Å) to about 4,000 angstroms (Å).

The P-well 54 is formed in a deep N-well 56 (e.g., semiconductor material that has been doped to have N-type conductivity) of the substrate 52. The deep N-well 56 is formed within a P-type conductivity substrate 57 (for simplicity, the substrate 57 is illustrated in FIG. 2 only). The P-well 54 disposed in the N-well 52 allows for biasing of the substrate 52 as described in greater detail below. The charge trapping regions 50 can optionally have an upper end that is disposed vertically higher than an upper surface of the substrate 52.

Each trench assembly 46 includes a first, or tunneling, dielectric layer 58 (although not physically arranged in the illustrated memory device 42 as a bottom layer, the tunneling dielectric layer is sometimes referred to in the art as a bottom dielectric layer) made from, for example, an oxide (e.g., silicon oxide or $SiO_2$). The tunneling dielectric layer 58 lines the trench and separates the respective charge trapping regions 50a and 50b from the substrate 52. More specifically, the tunneling dielectric layer 58 separates the charge trapping regions 50a and 50b from a channel region 60 that is laterally disposed between the charge trapping regions 50a and 50b. In one embodiment, the channel 60 length is about the same as the space between the trenches, or in the illustrated embodiment about 500 angstroms (Å) to about 1,000 angstroms (Å). In one embodiment, the thickness of the tunneling dielectric layer 58 in the area separating the charge trapping region 50 and the channel 60 is about thirty angstroms (Å) to about seventy-five angstroms (Å).

The tunneling dielectric layer 58 can also separate the charge trapping regions 50a and 50b from respective bit lines 62a and 62b disposed under the trenches and at least partially along the side walls of the trenches. The bit lines 62 can be formed by doping portions of the substrate 52 to have $N^+$ conductivity.

In general, each bit line 62 forms a "U-shaped" structure with a base region under the trench assembly 46 and laterally disposed arms extending upward from the base region along sidewalls of the trench assembly 46. The arms extend upward such that an upper end of each arm is disposed adjacent a lower end of the corresponding charge trapping region 50. In a preferred embodiment, the upper ends of the arms are higher than the lower ends of the charge trapping regions 50 by about fifty angstroms (Å) or more. In this embodiment, the diffused N+ bit lines 62 overlap with the charge trapping regions 50 in the vertical direction.

Each trench assembly 46 also includes a second, or select gate, dielectric layer 64 (although not physically arranged in the illustrated memory device 42 as a top layer, the second dielectric layer 64 is sometimes referred to in the art as a top dielectric layer) made from, for example, an oxide (e.g., silicon oxide or $SiO_2$). The second dielectric layer 64 is disposed adjacent the respective charge trapping regions 50 so as to separate the charge trapping region 50 from a select gate line 66 (sometime referred to herein as a select gate 66).

In one embodiment, the second dielectric layer in the area between the charge trapping regions 50 and the select gates 66 can be about seventy angstroms (Å) to about ninety angstroms (Å) thick. The select gates 66 can be formed from, for example, a conductive material such as a semiconductor (e.g., polycrystalline silicon) that has been doped to have P or $P^+$ conductivity. The first dielectric layer 58 and/or the second dielectric layer 64 separate the select gate 66 from the corresponding bit line 62.

Additional insulating material, such as from the dielectric layer 48, can be formed over the select gates 66 to separate the select gates 66 from the control gate line 44. In one embodiment, the select gates 66 and the control gate line 44 are separated by about two hundred angstroms (Å) of insulating material. In one embodiment, the control gate line 44 and the channel 60 are separated by about two hundred fifty angstroms (Å) of insulating material. An upper surface of the control gate line 44 can be reacted with a metal (e.g., cobalt, titanium, molybdenum, etc.) to form a silicide layer 68, such as $CoSi_x$.

As illustrated, the charge trapping regions 50 can be vertically disposed adjacent sidewalls of the select gates 66. In the illustrated embodiment, at least a portion of each select gate 66, at least a portion of each charge trapping region 50 and at least a portion of each channel region 60 are laterally aligned (e.g., at least partially overlapping in a lateral direction). In addition, each trench assembly 46 can include charge trapping regions 50a' or 50b' that form one of the complimentary charge trapping regions 50 for adjacent memory devices.

Electrical contact can be made to each select gate 66 using select gate line contacts 70 (FIG. 1) that traverse the dielectric layer 48 at regular intervals on the core memory array 40 (e.g., such as between every eighth or sixteenth control gate line 44). Electrical contact can be made to each bit line 62 using bit line contacts 72 (FIG. 1) that traverse the dielectric layer 48 at regular intervals on the core memory array 40 (e.g., such as between every eighth or sixteenth control gate line 44). In the illustrated embodiment, the bit line contacts 72 traverse the trench assemblies 46, such as by removing portions of the trench assemblies 46 in the area of bit line contacts 72 and lining the removed area with a dielectric material to isolate the bit line contacts 72 from the conductive portions and charge trapping portions of the trench assemblies 46. In an alternative embodiment, the bit line contacts 72 can be disposed to the side of the trench assemblies 46 and adjacent the select gate line contacts 70.

Application of appropriate voltages to the control gate lines 44, the select gates 66, and the bit lines 62 allows for the addressing of the memory devices 42 such that each charge trapping region 50 of each memory device 42 can be programmed, verified, read and/or erased.

Figure 3:
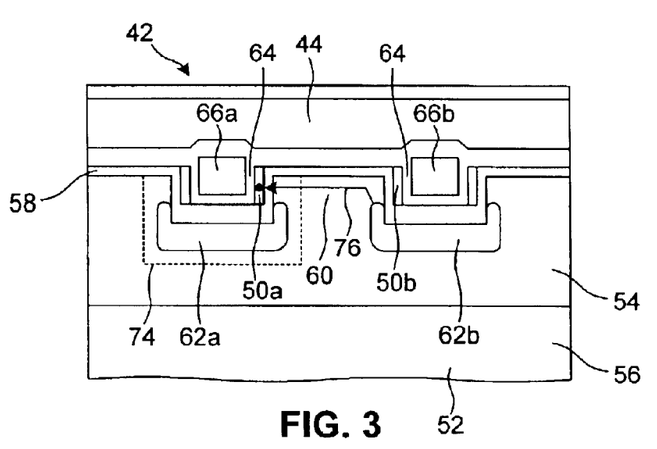
FIG. 3 is a schematic cross-section illustration of the exemplary memory device taken along the line 2—2 of FIG. 1 that includes a representation of a program operation.

With additional reference to FIG. 3, a program operation to store charge in the left hand charge trapping region 50a of the memory device 42 will be described. Programming of the right hand charge trapping region 50b can be accomplished in similar fashion, but by reversing the roles of the bit lines 62a and 62b as will be identified in greater detail below. However, for simplicity of the discussion herein, programming of only the left hand charge trapping region 50a will be described. It is noted that the memory device 42 is generally structurally symmetrical, allowing for programming, verifying, reading and erasing of the charge trapping regions 50 by respectively reversing the roles of the conductive bit line regions 62 (which function as source drain) during those operations. It is noted that the roles of the select gates 66 may also be reversed when conducting an operation on one of the sides of the memory device versus the other side of the memory device. Therefore, the terms source and drain can be used interchangeably, depending on the charge trapping region 50 of interest and operation being carried out.

Programming is accomplished by ballistic channel hot electron (CHE) injection. The electron injection technique does not rely on scattering of electrons, and is therefore referred to as ballistic CHE. Furthermore, the physical structure of the memory device 42 provides for a fairly direct path of electron travel laterally along the channel 60, through the tunneling dielectric layer 58 and into the charge trapping region 50a. Accordingly, a high percentage of electrons that have gain sufficient energy to overcome the potential barrier of the tunning dielectric layer 58 will become injected into the charge trapping region 50a to increase electron injection efficiency and lower the drain to source current ($I_{ds}$) used to program the charge trapping region 50a. During programming, the $I_{ds}$ can be on the order of about one micro-Amp (µA).

To program one of the charge trapping regions 50a, 50b, voltage potentials can be applied to the components of the memory device 42. Exemplary voltage potential ranges for each component are shown in Table 1.

TABLE 1

| Region Programmed | Select Gate 66a | Select Gate 66b | Bit Line 62a | Control Gate 44 | P-well 54 | Bit Line 62b |
|---|---|---|---|---|---|---|
| Region 50a | ~5 V to ~7 V | ~5 V to ~7 V | ~3 V to ~4.5 V | Vcg − Vt = ~1 V | ~−1 V to ~0 V | ~0.0 V to ~0.2 V |
| Region 50b | ~5 V to ~7 V | ~5 V to ~7 V | ~0.0 V to ~0.2 V | Vcg − Vt = ~1 V | ~−1 V to ~0 V | ~3 V to ~4.5 V |

Continuing with the example where the left hand charge trapping region 50a is programmed, the effect of the applied voltage potentials will be described in greater detail. The equation under the control gate 44 column of Table 1 specifies that the control gate 44 voltage (Vcg) minus memory device 42 threshold voltage (Vt) over the channel region 60 can be less than about one volt. This equation can be balanced such that the voltage applied to the control gate 44 is about one volt higher than the threshold voltage of the memory device 42. In one embodiment, the voltage applied to the control gate 44 is about one volt higher than the threshold voltage of the memory device associated with the channel region 60. In this manner, the channel 60 becomes "slightly" turned on, or inverted to an extent such that electrons are drawn off the bit line 62b (i.e., the bit line 62 opposite the programmed charge trapping region 50) towards the bit line 62a (i.e., the bit line 62 adjacent the programmed charge trapping cell 50). It is noted that the bit line 62b functions as a source during this program operation and the bit line 62a functions as a drain. In addition, the potential applied to the source side select gate 66b assists in reducing junction resistance between the channel 60 and the source side bit line 62b by inverting (or "turning on") the channel 60 adjacent the source side bit line 62b. The potential applied to the drain side select gate assists in defining a channel traversal path of the electrons and for assisting in increasing the energy level of the electrons.

A small bias voltage can optionally be applied to the source bit line 62b to enhance control over electron injection into the charge trapping region 50a. Another bias voltage can be applied to the P-well 54. More specifically, the P-well can optionally be biased to enhance electron movement from source to drain.

The potential applied to drain (bit line 62a) creates a drain depletion region surrounding the drain (the depletion region indicated by dashed line 74. The potentials applied to the bit lines 62a and 62b and the drain create a lateral electric field from the charge trapping region 50a through the tunneling dielectric layer 50 to the channel 60 such that the electrons drawn off the source accelerate as they traverse the channel and become energetic.

Some of those energetic electrons will ballistically (without the assistance of phonon scattering) become injected into the charge trapping region 50a and become trapped therein. In one embodiment, the probability that the electrons will become injected is highest adjacent the upper corner of the trench formed in the semiconductor substrate 52 (i.e., laterally between the upper end of the arm of the bit line 62a and the upper surface of the semiconductor substrate 52). The trapped electrons tend not to spread through the charge trapping region 50 due to this layer's low conductivity and low vertical electric field therein.

As illustrated by arrow 76, electrons will have a tendency to be drawn off an upper portion of the arm of the source side bit line 62b and move upward slightly into the channel region by the influence of a vertical electric field created mainly by the potential applied to the control gate line 44 and the P-well bias potential. As indicated, these electrons are drawn across the channel 60 by the lateral electric field therein. Accordingly, the channel 60 can be considered a "bent" channel 60 where electrons move upward (and perhaps with some lateral movement) and laterally. Any phonon scattering of the electrons as they traverse the channel 60 may have the effect of slightly lowering electron injection efficiency, but is believed to have very little impact of charge injection into the charge trapping region 50.

Reading of the charge trapping regions 50 can be carried out using, for example, a reverse read operation. Similar to the discussion of the programming operation, the read operation will be described with respect to reading the left hand charge trapping region 50a. However, reading of the right hand charge trapping reading 50b can be accomplished by switching the roles of the select gates 66a and 66b and the bit lines 62a and 62b.

Table 2 identifies exemplary voltage potential ranges for each component of the memory device 42 during reading of either of the charge trapping regions 50a or 50b.

TABLE 2

| Region Read | Select Gate 66a | Select Gate 66b | Bit Line 62a | Control Gate 44 | P-well 54 | Bit Line 62b |
|---|---|---|---|---|---|---|
| Region 50a | ~3 V to ~4.5 V | ~4 V to ~5 V | ~0 V | ~4 V to ~5 V | ~0 V | ~0.7 V to ~2 V |
| Region 50b | ~4 V to ~5 V | ~3 V to ~4.5 V | ~0.7 V to ~2 V | ~4 V to ~5 V | ~0 V | ~0 V |

It is noted that the during the reverse read operation, the bit line 62 adjacent the read charge trapping region 50 functions as the source and the bit line 62 adjacent the unread charge trapping region 50 functions as the drain. In one embodiment, prior to conducting the read operation a DC voltage can be applied to the select gates 66 to lower the natural resistance of the P-type semiconductor material of the select gates 66.

The drain to source current measuring during the application of the read pulse voltages (e.g., the voltages identified in Table 2) can be compared against a reference current to determine whether the read (or interrogated) charge trapping region 50 is in the blank program state or the charged program state. The potential appllied to the drain can function to mask, or "cover up," charge stored by the unread charge trapping region 50.

Figure 4:
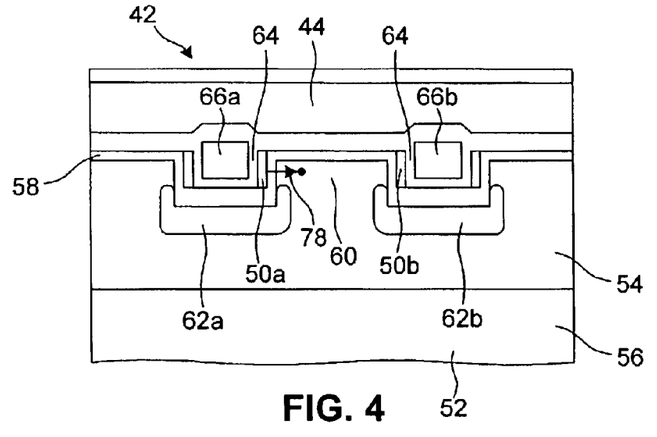
FIG. 4 is a schematic cross-section illustration of the exemplary memory device taken along the line 2—2 of FIG. 1 that includes a representation of an erase operation.

With additional reference to FIG. 4, an erase operation of the memory device 42 will be described. Both of the charge trapping regions 50 can be erase simultaneously by the application of voltage potentials to various components of the memory device 42. Table 3 identified exemplary erase potentials for each component of the memory device 42 during simultaneous erasing of the charge trapping regions 50a and 50b.

TABLE 3

| Select Gate 66a | Select Gate 66b | Bit Line 62a | Control Gate 44 | P-well 54 | Bit Line 62b |
|---|---|---|---|---|---|
| ~−8 V to ~−10 V | ~−8 V to ~−10 V | Float | ~0 V | ~−7 to ~−10 V | Float |

With the tunnel dielectric layer 58 being about thirty angstroms (Å) to about seventy-five angstroms (Å) thick between the charge trapping regions 50 and the channel 60, the application of a relatively large positive potential to the P-well and a relatively large negative potential to the select gates 66 will cause stored electrons to tunnel through the tunnel dielectric layer 58 and into the substrate 52 as indicated by arrow 78. The P+conductivity type select gates 66, which induce a higher barrier height for electron tunneling than N type or N$^+$ type conductivity materials, inhibit or minimize electron injection from the select gates 66 into the charge trapping regions 50. The foregoing erase technique where electrons are removed from a charge trapping layer through a dielectric layer is often referred to in the art as Fowler-Nordheim (FN) tunneling.

Figure 5:
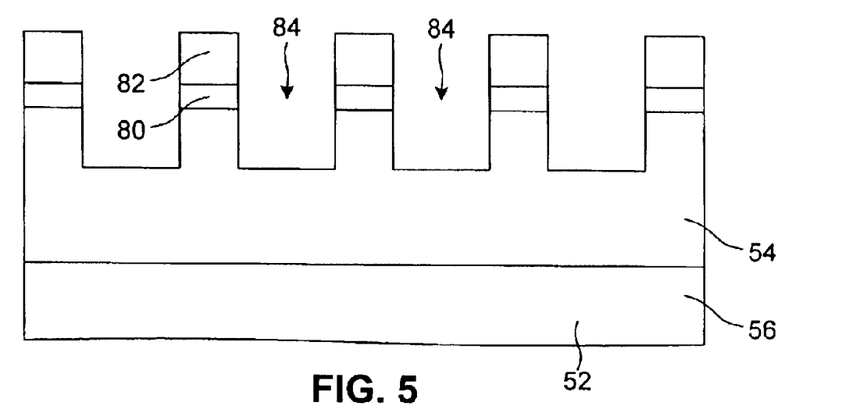
FIGS. 5 through 9 are schematic cross-section illustrations of the core memory array during various stages of fabrication.

With reference now to FIG. 5, a method of fabricating the core memory array 40 having the plurality of memory devices 42 (FIGS. 1 and 2) will be described in greater detail. The method can start by providing the substrate 52, such as from a silicon wafer. The substrate 52 can then be doped to provide the deep N-well 56. For example, high energy N-type impurities (e.g., arsenic ions, phosphorous ions or antimony ions) can be implanted into the substrate 52. Thereafter, the substrate 52 can be doped to provide the P-well. For example, P-type impurities (e.g., boron ions, gallium ions or indium ions) can be implanted into the substrate 52.

Following formation of the N-well 56 and the P-well 54, a hard mask layer 80 can be formed over the substrate 52. The hard mask layer 80 can be formed from a nitride (e.g., $Si_3N_4$). A photoresist layer 82 can be formed over the hard mask layer 80. The photoresist layer 82 can then be patterned to provide an array of lines and spaces where the line will be used to protect the hard mask layer 80 and the substrate 52 from being etched. The line width of the photoresist lines can be reduced by resist trimming so that, following an etch of the substrate 52, resulting trenches 84 in the P-well portion 54 of the substrate 52 are wider than the lithographic space width of the patterned photoresist layer 82. In one embodiment, the trenches 84 can be about three hundred angstroms (Å) to about 1,500 angstroms (Å) deep and about 1,000 angstroms (Å) to about 3,000 angstroms (Å) wide. Each trench 84 can be spaced apart by about 500 angstroms (Å) to about 1,000 angstroms (Å), for a trench pitch of about 1,500 angstroms (Å) to about 4,000 angstroms (Å).

Figure 6:
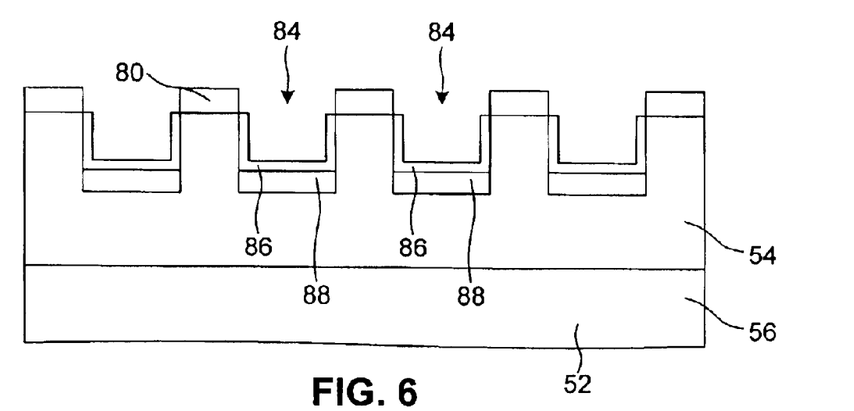

With additional reference to FIG. 6, after the hard mask layer 80 and the substrate 52 have been etched to form the trenches 84, the remaining portions of the photoresist layer 82 can be removed. Thereafter, an initial sacrificial layer of thermal oxide 86 (e.g., silicon oxide or $SiO_2$) of about 40 angstroms (Å) to about 70 angstroms (Å) thick can be grown to line each of the trenches 84.

Next, impurities to form the N$^+$ bit lines 62 (FIG. 2) can be implanted into the substrate 52 to form N$^+$ regions 88 under each of the thermal oxide layers 86. During N$^+$ ion implantation, the hard mask layer 80 minimizes N$^+$ ion implantation into the areas of the substrate 52 between the trenches 84.

Figure 7:
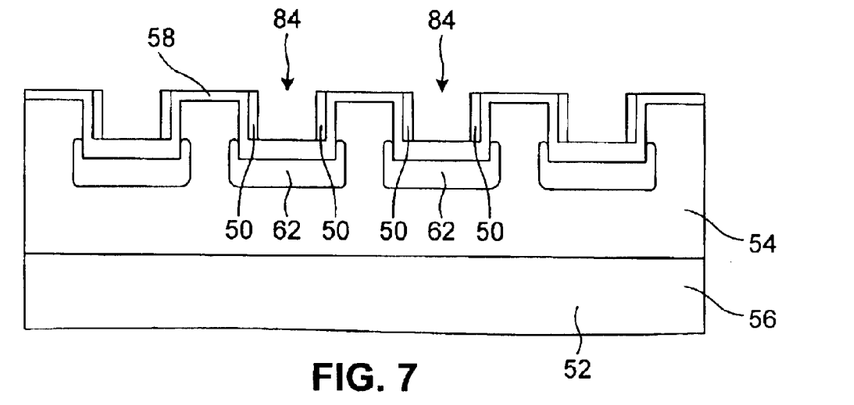

With additional reference to FIG. 7, after N$^+$ ion implantation, the hard mask layer 80 can be removed. Next, thermal oxide (e.g., silicon oxide or $SiO_2$) can be regrown such that about thirty angstroms (Å) to about seventy-five angstroms (Å) of oxide line the sidewalls of each trench 84. During the oxide regrowth process, oxide will also be grown on top of the substrate 52 and the oxide disposed along the bottom of the trench 84 will have a tendency to become thicker because it is grown over the heavily doped N+silicon. As a result, the tunnel dielectric layer 58 is formed.

The oxide regrowth process can be carried out by annealing the wafer at relatively high temperature in an oxygen rich atmosphere. During the anneal, the N$^+$ regions 88 will diffuse into the surrounding substrate 52 to form the bit lines 62. More specifically, the implant ions will have a tendency to spread upward, downward and outward from the initial implanted regions 88 to form the base and arms of the generally "U-shaped" bit lines 62 that partially surround the bottom of the trenches 84 as illustrated. The anneal can also be used to activate to dopant species of the bit lines 62. Alternatively, separate anneal cycles can be used to regrow the oxide, diffuse the dopant species and/or activate the dopant species.

Next, the charge trapping regions 50 can be formed. For example, a layer of suitable material, such as a nitride (e.g., $Si_3N_4$) can be deposed to conform to the tunnel dielectric layer 58. Next, the conformal material layer can be dry etched back to form the vertically disposed charge trapping regions 50 along and adjacent side walls of the trenches 84. As indicated, the charge trapping regions 50 can be about fifty angstroms (Å) to about one hundred angstroms (Å) thick in the lateral direction. As should be appreciated, another dielectric material, such as a high-K material, can be used for the charge trapping regions 50.

Figure 8:
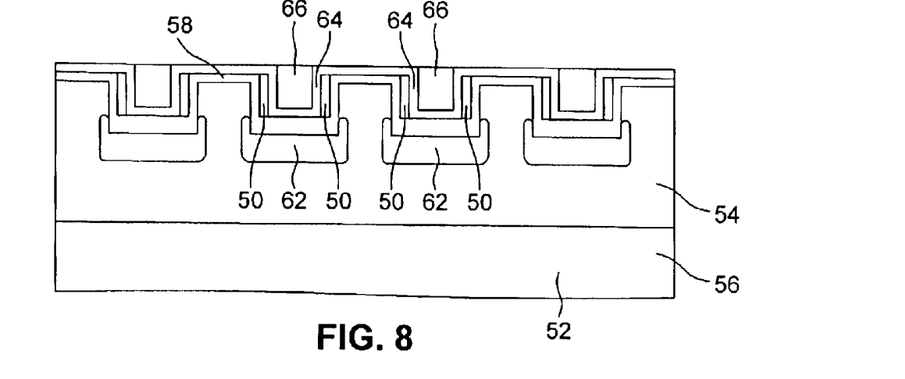

With additional reference to FIG. 8, a dielectric layer to form the select gate dielectric layer 64 can be formed. The select gate dielectric layer 64 can be made from an oxide (e.g., silicon oxide or $SiO_2$) and can conform to the tunnel dielectric layer 58 material disposed over the upper surface of the substrate 52, the charge trapping regions 50 and the oxide formed over the bottom of the trenches 84. In one embodiment, the select gate dielectric layer 64 is made by a high temperature oxidation (HTO) process or a tetraethyl orthosilicate (TEOS) process. As a result, the charge trapping regions 50 become "sandwiched" between the select gate dielectric layer 64 and the tunnel dielectric layer 58. In one embodiment, the select gate dielectric layer 64 adjacent the charge trapping regions 50 can have a lateral thickness of about seventy angstroms (Å) to about ninety angstroms (Å). As should be appreciated, another dielectric material, such as a high-K material, can be used for the select gate dielectric layer 64.

Thereafter, select gates 66 can be formed. For example, the trenches can be filled with polycrystalline silicon (also known as poly-silicon or "poly 1"). In one embodiment, the trenches 84 are over filled and the excess poly-silicon is removed by an etch back technique or a chemical-mechanical planarizaUon (CMP) technique. The poly-silicon can be implanted with impurities to have P+ conductivity.

Figure 9:
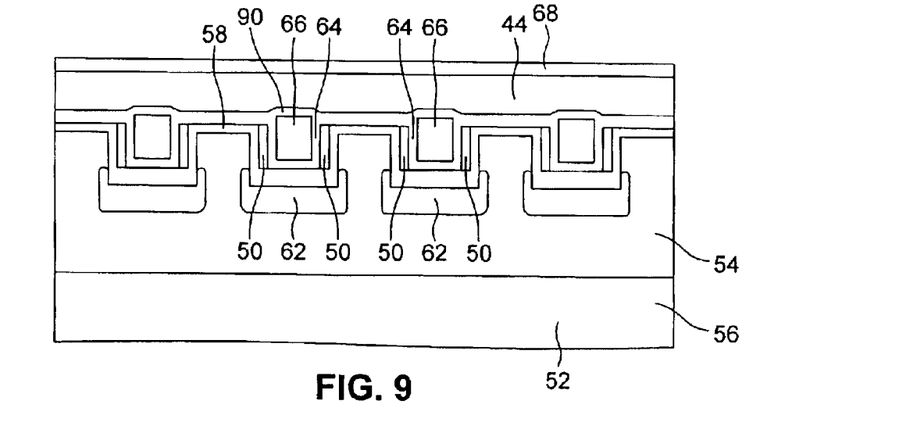

With additional reference to FIG. 9, additional dielectric material 90 can be formed over the wafer to cover the top surfaces of the select gates 66 and optionally to increase the thickness of the select gate dielectric layer 64 in areas over the upper surface of the substrate 52. In one embodiment, the additional dielectric material is oxide formed by a process such as thermal oxidation or by depositing an oxide film such as HTO or TEOS. The additional dielectric material 90 can selectively be formed such that about two hundred angstroms (Å) of dielectric material is formed over select gates 66 and a total of about 250 angstroms (Å) of dielectric material (from the tunnel dielectric layer 58, the select gate dielectric (residual) layer 64 and/or the additional dielectric material 90) is formed over the upper surface of the substrate 52. Alternatively, the dielectric material over the upper surface of the substrate can be etched to the desired thickness from a thicker amount of material. Therefore, in one embodiment, the channel region 60 (FIG. 2) and the control gate line 44 (FIG. 2) can be separated by about 250 angstroms (Å) of dielectric material, which can also be referred to as a gate dielectric. Although illustrated as separate layers, the dielectric material formed over the upper surface of the substrate 52 (from the tunnel dielectric layer 58, the select gate dielectric (residual) layer 64 and/or the additional dielectric material 90) is effectively one layer of material.

Next, the control gate lines 44 can be formed by depositing a layer of material, such as polycrystalline silicon (or "poly 2"), implanting the poly 2 with ions to have N+ conductivity and patterning the control gate lines 44 from the material. Thereafter, the silicide layer 68 can be formed by depositing a layer of metal (e.g., cobalt, titanium, molybdenum, etc.) over the control gate lines 44 and reacting the metal with the poly 2.

As one skilled in the art will appreciate, the foregoing processing of fabricating the core memory array 40 can be modified as desired. For example, certain steps can be omitted, various steps can be added and/or certain steps can be carried out in other orders. In addition, modifications such as changing types of materials (e.g., metal or metal containing bit lines 62, select gates 66 and control gates 44 could be used), changing layer thicknesses and so forth can be made.

Although particular embodiments of the invention have been described in detail, it is understood that the invention is not limited correspondingly in scope, but includes all changes, modifications and equivalents coming within the spirit and terms of the claims appended hereto. For example, adjustment to the program, read and erase pulse voltage potentials can be made.

What is claimed is:

1. A memory device, comprising:
    a semiconductor channel controlled by a gate electrode;
    a charge trapping region disposed laterally adjacent a first end of the channel;
    a first conductive region disposed adjacent the first end of the channel and functioning as a drain during programming of the charge trapping region; and
    a second conductive region disposed adjacent a second end of the channel and functioning as a source during programming of the charge trapping region, and wherein during programming of the charge trapping region electrons are drawn off the source and into the channel, the electrons traverse the channel from second end to first end and become energetic during the traversal so as to ballistically become injected into the charge trapping region through the first end of the channel.

2. The memory device according to claim 1, further comprising a first select gate adjacent the charge trapping region for contributing to defining the channel traversal path of the electrons.

3. The memory device according to claim 2, further comprising a second select gate adjacent the second end of the channel for reducing junction resistance between the second conductive region and the channel.

4. A memory device, comprising:
    a) a first charge trapping region having at least a portion thereof disposed laterally adjacent a first end of a channel region and separated from the channel by a first tunnel dielectric region;
    b) a first select gate disposed laterally adjacent the first charge trapping region opposite the channel and separated from the first charge trapping region by a first select gate dielectric region;
    c) a second charge trapping region having at least a portion thereof disposed laterally adjacent a second end of a channel region and separated from the channel by a second tunnel dielectric region;
    d) a second select gate disposed laterally adjacent the second charge trapping region opposite the channel and separated from the second charge trapping region by a second select gate dielectric region;
    e) a control gate disposed over the channel and separated therefrom by a control gate dielectric;
    f) a first conductive region having at least a portion thereof disposed under the first end of the channel adjacent the first tunnel dielectric region; and
    g) a second conductive region having at least a portion thereof disposed under the second end of the channel adjacent the second tunnel dielectric region.

5. The memory device according to claim 4, wherein the charge trapping regions are formed from a dielectric material.

6. The memory device according to claim 5, wherein the charge trapping regions are formed from silicon nitride.

7. The memory device according to claim 4, wherein, during programming of the first charge trapping region, the first conductive region functions as a drain and the second conductive region functions as a source.

8. The memory device according to claim 4, wherein the first charge trapping region and the first select gate are formed in a first trench formed in a semiconductor substrate and the second charge trapping region and the second select gate are formed in a second trench formed in the semiconductor substrate.

9. The memory device according to claim 8, wherein the first conductive region is a first bit line surrounding a bottom portion of the first trench and the second conductive region is a second bit line surrounding a bottom portion of the second trench.

10. The memory device according to claim 8, wherein the trenches are formed in a P-well of the substrate.

11. The memory device according to claim 10, wherein the P-well is formed in a deeper N-well of the substrate.

12. The memory device according to claim 4, wherein the tunnel dielectric regions are about thirty angstroms to about seventy-five angstroms thick and the select gates have P+ conductivity.

13. The memory device according to claim 12, wherein electron charge stored in the charge trapping regions can be removed from the charge trapping regions and into a substrate by an FN tunneling process.

14. The memory device according to claim 4, wherein electron charge stored in the charge trapping regions can be removed from the charge trapping regions and into a substrate by an FN tunneling process.

15. The memory device according to claim 4, wherein the charge trapping regions are readable in a reverse read operation.

16. The memory device according to claim 15, wherein the reverse read operation includes applying a bias to the select gate to lower a resistance of the select gate material.

17. A core memory array, comprising:
a plurality of trench assemblies, each trench assembly formed in a semiconductor substrate and including a select gate disposed between a first and a second charge trapping region and separated from the charge trapping regions by respective select gate dielectric regions, the select gate at least partially overlapping each of the charge trapping regions in a lateral direction;
a plurality of word lines disposed over the trench assemblies and extending in a transverse direction to the trench assemblies, each word line defining a channel in the substrate between adjacent pairs of trench assemblies, a portion of each channel at least partially overlapping each of the charge trapping regions in a lateral direction; and
a bit line associated with each trench assembly having a least a first portion thereof disposed under an end of the channel adjacent the first charge trapping region and a second portion thereof disposed under an end of the channel adjacent the second charge trapping region.

18. The core memory array according to claim 17, wherein the charge trapping regions are formed from a dielectric material.

19. The core memory array according to claim 18, wherein the charge trapping regions are formed from silicon nitride.

20. The core memory array according to claim 17, wherein, during programming of one of the charge trapping regions of one of the trench assemblies, the associated conductive region functions as a drain.

21. The core memory array according to claim 17, wherein the conductive regions are bit lines surrounding a bottom portion of the respective trench assemblies.

22. The core memory array according the claim 17, wherein the trench assemblies further include a first and a second tunnel dielectric region for respectively separating the charge trapping regions from the channels that are respectively disposed adjacent the charge trapping regions.

23. The core memory array according to claim 17, wherein the trenches are formed in a P-well of the substrate.

24. The core memory array according to claim 23, wherein the P-well is formed in a deeper N-well of the substrate.

25. A method of programming a memory device having a dielectric charge trapping region, comprising:
moving an electron laterally within a channel, the channel having a first end at least partially overlapping the charge trapping region in a lateral direction, the electron gaining energy during lateral movement within the channel; and
ballistically injecting the electron into the charge trapping region through the first end of the channel and through a tunnel dielectric layer.

26. The method according to claim 25, further comprising drawing the electron off of a source adjacent a second end of the channel and into the channel, wherein the electron changes direction upon entering the channel.

27. The method according to claim 26, further comprising applying a bias potential to the source.

28. The method according to claim 25, further comprising establishing a drain depletion region adjacent the charge trapping region.

29. The method according to claim 25, further comprising applying a voltage potential to a gate electrode disposed over the channel to invert at least a portion of the channel.

30. The method according to claim 29, wherein the voltage potential applied to the gate ($V_{cg}$) satisfies the equation: $V_{cg}-Vt$=about one volt, wherein Vt is a threshold voltage of the memory device.

31. The method according to claim 25, further comprising applying a voltage potential to a select gate disposed adjacent the charge trapping region on a side of the charge trapping region opposite the channel, the select gate at least partially overlapping the charge trapping region in the lateral direction.

32. The method according to claim 25, further comprising applying a bias potential to the channel.

* * * * *

UNITED STATES PATENT AND TRADEMARK OFFICE
CERTIFICATE OF CORRECTION

PATENT NO. : 6,754,105 B1 Page 1 of 1
APPLICATION NO. : 10/430582
DATED : June 22, 2004
INVENTOR(S) : Chang et al.

It is certified that error appears in the above-identified patent and that said Letters Patent is hereby corrected as shown below:

Column 2, line 51, replace "region," with --region;--.
Column 9, line 33, replace "P+conductivity" with --$P^+$ conductivity--.
Column 10, line 28, replace "N+silicon" with --N+ silicon--.
Column 11, line 10, replace "planarizaUon" with --planarization--.

Signed and Sealed this

Twenty-ninth Day of May, 2007

JON W. DUDAS
*Director of the United States Patent and Trademark Office*